(12) United States Patent
Convert et al.

(10) Patent No.: US 10,325,850 B1
(45) Date of Patent: Jun. 18, 2019

(54) GROUND PATTERN FOR SOLDERABILITY AND RADIO-FREQUENCY PROPERTIES IN MILLIMETER-WAVE PACKAGES

(71) Applicant: MACOM Technology Solutions Holdings, Inc., Lowell, MA (US)

(72) Inventors: Emmanuelle R. O. Convert, Cammeray (AU); Ryan M. Clement, Bogangar (AU); Simon J. Mahon, Avalon (AU); Leif G. M. Snygg, Partille (SE)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/850,097

(22) Filed: Dec. 21, 2017

Related U.S. Application Data

(63) Continuation-in-part of application No. 15/788,012, filed on Oct. 19, 2017.

(60) Provisional application No. 62/410,588, filed on Oct. 20, 2016.

(51) Int. Cl.
| | | |
|---|---|---|
| *H01L 23/528* | (2006.01) | |
| *H01P 3/10* | (2006.01) | |
| *H01L 23/492* | (2006.01) | |
| *H01L 23/66* | (2006.01) | |
| *H01L 23/06* | (2006.01) | |
| *H01L 23/498* | (2006.01) | |

(52) U.S. Cl.
CPC ........ *H01L 23/5286* (2013.01); *H01L 23/492* (2013.01); *H01L 23/66* (2013.01); *H01P 3/10* (2013.01); *H01L 23/06* (2013.01); *H01L 23/498* (2013.01)

(58) Field of Classification Search
None
See application file for complete search history.

(56) References Cited

U.S. PATENT DOCUMENTS

| | | | | |
|---|---|---|---|---|
| 5,956,840 A | * | 9/1999 | Chan ...................... | H01L 23/66 205/118 |
| 5,982,250 A | * | 11/1999 | Hung ................. | H01L 23/49822 257/E23.062 |
| 6,239,669 B1 | * | 5/2001 | Koriyama ............... | H01L 23/66 333/247 |
| 7,019,600 B2 | * | 3/2006 | Shono ..................... | H01P 5/107 333/247 |

(Continued)

*Primary Examiner* — Andres Munoz
(74) *Attorney, Agent, or Firm* — Thomas | Horstemeyer, LLP; Michael J. D'Aurelio; Jason M. Perilla

(57) ABSTRACT

An apparatus includes a laminate and a lid. The laminate generally includes a dielectric layer between a first conductive layer and a second conductive layer. The first conductive layer may include a probe configured to transfer a radio-frequency signal in a millimeter-wave band. The second conductive layer may be configured to provide a continuous ground plane parallel to the probe and separated from the probe by the dielectric layer. A plurality of channels may be (a) formed into a side of the second conductive layer opposite the dielectric layer, (b) formed to a depth less than a thickness of the second conductive layer, and (c) sized to permit gasses formed while securing the laminate to a substrate to escape from between the laminate and the substrate. The lid may be in contact with the first conductive layer.

20 Claims, 14 Drawing Sheets

(56) References Cited

U.S. PATENT DOCUMENTS

| | | | | |
|---|---|---|---|---|
| 7,095,292 B2* | 8/2006 | Sayanagi | ............... | H01L 23/66 |
| | | | | 333/26 |
| 7,522,014 B2* | 4/2009 | Koriyama | ............... | H01L 23/66 |
| | | | | 333/246 |
| 8,624,373 B2* | 1/2014 | Camiade | ............... | H01P 5/107 |
| | | | | 257/686 |
| 9,577,310 B2* | 2/2017 | Kuwabara | ............... | H01L 23/66 |
| 2003/0024633 A1* | 2/2003 | Ogura | ............... | H01L 23/66 |
| | | | | 156/250 |
| 2012/0050125 A1* | 3/2012 | Leiba | ............... | H01Q 1/2283 |
| | | | | 343/834 |
| 2015/0262842 A1* | 9/2015 | Iijima | ............... | H01L 21/52 |
| | | | | 257/664 |

* cited by examiner

US 10,325,850 B1

GROUND PATTERN FOR SOLDERABILITY AND RADIO-FREQUENCY PROPERTIES IN MILLIMETER-WAVE PACKAGES

This application relates to U.S. Ser. No. 15/788,012, filed Oct. 19, 2017, which relates to U.S. Provisional Application No. 62/410,588, filed Oct. 20, 2016, which is hereby incorporated by reference in its entirety.

FIELD OF THE INVENTION

The invention relates to millimeter-wave devices generally and, more particularly, to a method and/or apparatus for implementing a ground pattern for solderability and radio-frequency properties in millimeter-wave packages.

BACKGROUND

Packages and modules having components with large ground connections are difficult to solder due to a build up of hot gasses that cannot escape between the components and a mounting surface. The hot gasses create voids in the solder when the package cools after reflow. The voids cause heating problems for high power components at all frequencies. For packages and modules at higher frequencies, a detrimental impact on radio frequency grounding is experienced.

A conventional solution is to break the large ground area connections into isolated subsections thereby creating gaps between the areas of ground metal through which the hot gasses can escape. At low frequencies the gaps provide an acceptable degradation of the ground plane. At middle frequencies, the gap approach starts to fail as the extra discontinuities in the ground plane matter. At high frequencies, multilayer packages with various gaps start to deteriorate as the parasitics of vertical trace transitions through the multilayer package start to become important.

It would be desirable to implement a ground pattern for solderability and radio-frequency properties in millimeter-wave packages.

SUMMARY

The invention concerns apparatus including a laminate and a lid. The laminate generally includes a dielectric layer between a first conductive layer and a second conductive layer. The first conductive layer may include a probe configured to transfer a radio-frequency signal in a millimeter-wave band. The second conductive layer may be configured to provide a continuous ground plane parallel to the probe and separated from the probe by the dielectric layer. A plurality of channels may be (a) formed into a side of the second conductive layer opposite the dielectric layer, (b) formed to a depth less than a thickness of the second conductive layer, and (c) sized to permit gasses formed while securing the laminate to a substrate to escape from between the laminate and the substrate. The lid may be in contact with the first conductive layer.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a ground pattern for solderability and radio-frequency properties in millimeter-wave packages that may (i) provide a robust package, (ii) provide an inexpensive package, (iii) reduce void formation during reflow processes, (iv) enhance manufacturability, (v) maintain a continuous ground plane for probes, (vi) enhance solderability, (vii) operate with WR12 waveguides, (viii) minimize losses between a chip and the waveguide, (ix) enhance signal integrity, (x) enhance manufacturability and/or (xi) be implemented as one or more integrated circuits.

Various embodiments of the invention may use a simple core package or module (e.g., a single core package or a single dielectric package) for high-frequency (e.g., E band) applications and provide a partial-etch (e.g., half-etch) pattern in a ground plane (or ground paddle) of a component (or carrier). The pattern in the ground plane generally provides channels that enable hot gasses generated during reflow processing to escape. The pattern may also maintain a continuous (or solid) ground plane layer under one or more components (e.g., monolithic microwave integrated circuits (MMICs), microstrips, grounded coplanar waveguides, antenna probe feeds and/or other microwave and millimeter-wave structures) inside the package. The channel patterns may be a series of parallel lines (e.g., parallel channels), crossing lines (e.g., crossing channels), curved lines (e.g., curved channels), tapered lines (e.g., tapered channels) and/or other patterns. The partial-etched ground plane generally allows both outgassing during reflow processing and good radio-frequency grounding in operation.

Figure 1:
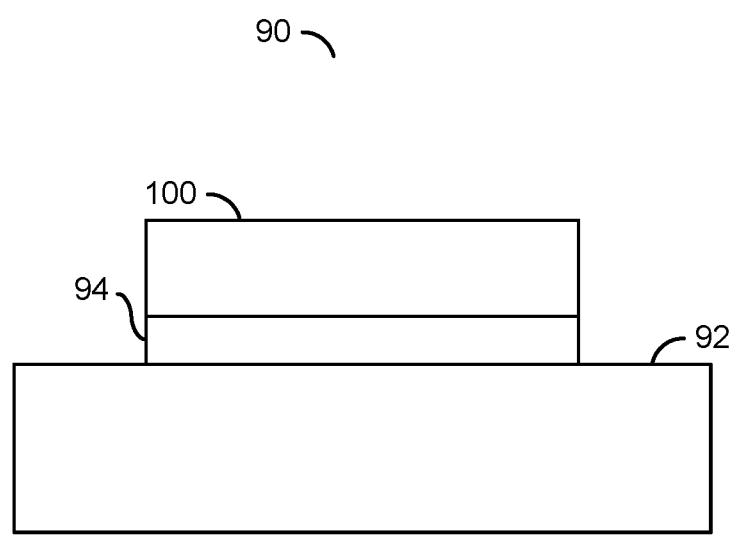
FIG. 1 is a block diagram of an apparatus.

Referring to FIG. 1, a block diagram of an apparatus 90 is shown. The apparatus (or device or part) 90 generally comprises a device (or circuit) 92, a layer 94 and a device (or circuit) 100. The view is generally a side view of the apparatus 90. The assembly 90 generally implements a module easily coupled to a microwave and/or millimeter wave waveguide. The module generally includes the MMICs, microstrips, grounded coplanar waveguides, antenna probe feeds and other structures. The channels in a lower surface of the module may provide for improved solderability by allowing gases formed during the soldering to escape from between the module and the carrier.

The circuit 92 may implement a multilayer substrate (or carrier). In various embodiments, the substrate 92 may be a circuit board, printed circuit board, ceramic substrate, metal carrier, or the like. The circuit 92 may include a conductive layer on a top surface (as shown in FIG. 1) and an insulating layer below the conductive layer.

The layer 94 may implement a solder layer. The solder layer 94 is generally operational to provide electrical and physical connections between the top surface of the substrate 92 and a facing surface (e.g., a bottom surface as shown in FIG. 1) of the circuit 100. In various embodiments, the solder layer 94 is formed on the substrate 92. When heated, the solder layer 94 solders (or attaches or bonds) the circuit 100 to the substrate 92. During a reflow of the solder, the solder layer 94 may produce gases between the substrate 92 and the circuit 100. Channels formed in the bottom surface of the circuit 100 may provide one or more paths for the gas to escape from between the substrate 92 and the circuit 100.

The circuit 100 may implement a package (or device or assembly). The package 100 generally implements a robust and inexpensive millimeter-wave package for waveguide E band products that incorporate a waveguide transition inside a multi-chamber cavity dielectric package. A multilayer substrate (or laminate) of the package 100 may enhance robustness, signal integrity and/or manufacturability with a metal-coated cavity for a backshort (or shorting plate) and the use of metal back-vias (e.g., round vias or slot vias) to create a waveguide inside the dielectric allowing one or more thin dielectric layers to be used for signal transmission with low loss and without multi-moding.

Figure 2:
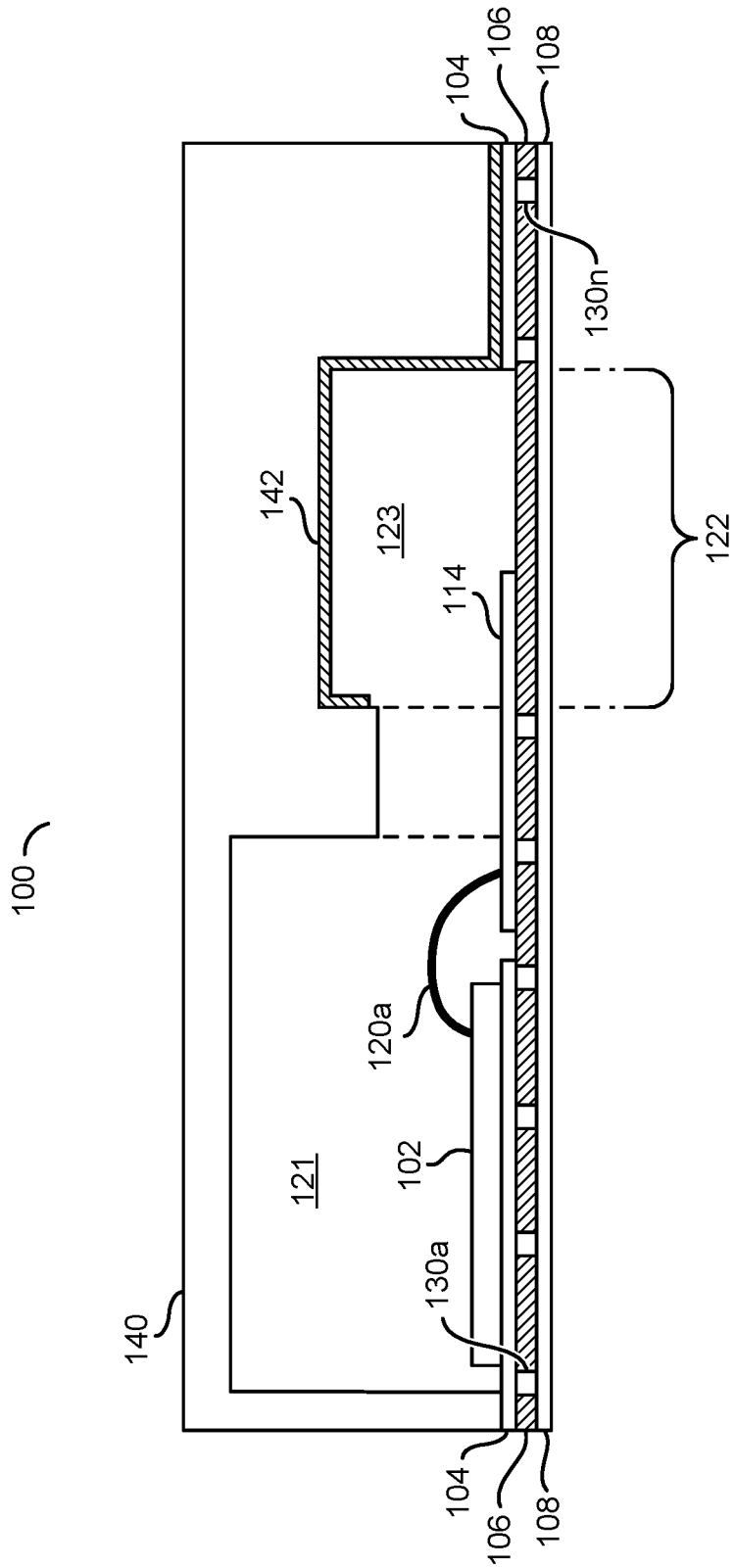
FIG. 2 is a diagram of a cross-sectional view of a package of the apparatus is shown in accordance with an embodiment of the invention.

Referring to FIG. 2, a diagram of a cross-sectional view of the package 100 is shown in accordance with an embodiment of the invention. The package 100 generally comprises a component (or circuit), a laminate (or board) and a lid (or cover).

A component 102 may be implemented as one or more chips (or die). In various embodiments, the chip 102 may be implemented as a monolithic microwave integrated circuit. In various embodiments, the chip 102 may be a power amplifier, a low-noise amplifier, an integrated transmitter, an integrated receiver and/or a switch.

The laminate generally comprises a layer 104, a layer 106 and a layer 108. The layer 104 may implement an upper conductive (or metal) layer. In some embodiments, the conductive layer 104 may be implemented in metal (e.g., copper). The conductive layer 104 may include bonding pads, traces, probes and mounting features to secure integrated circuits (or chips or dies).

The layer 106 may implement a dielectric (or insulating) layer. The dielectric layer 106 is generally designed for good radio-frequency performance characteristics. In some embodiments, the dielectric layer 106 may be implemented with a Rogers 4350 material.

The layer 108 may implement a lower conductive (or metal) layer. The conductive layer 108 may include a cutout at a waveguide such that the conductive layer 108 does not block signals in the waveguide. In various embodiments, the conductive layer 108 may form a ground plane. In some embodiments, the conductive layer 108 may be implemented in metal (e.g., copper). The conductive layer 108 may reside on an opposite side of the dielectric layer 106 as the upper conductive layer 104. The conductive layer 108 may be connected (e.g., soldered) to the substrate 92.

A component 114 may implement a probe (or trace or probe launch or waveguide antenna). The probe 114 is generally formed in the conductive layer 104 and reside on an upper surface of the dielectric layer 106. The probe 114 may implement an antenna useful for radio-frequency transmissions and/or receptions.

One or more components 120a may implement multiple wire bonds between the bonding pad 118 and the probe 114. In some embodiments, a single wire bond 120a may connect a bonding pad to the probe 114.

A component 121 may implement a cavity formed in the lid. The cavity 121 may contain the chip 102.

A component 122 generally defines the waveguide that the package 100 forms a part of and generally extends away from the package 100 (e.g., through the printed circuit board). In various embodiments, the waveguide 122 may implement a WR12 waveguide. Other waveguides may be implemented to meet the design criteria of a particular application.

A component 123 may implement a cavity in the lid that forms the backshort for the waveguide 122.

Multiple components 130a-130n may implement vias in the dielectric layer 106. The vias 130a-130n may be filled with a conductive material (or conductor) and in electrical connection with the conductive layers 104 and/or 108. Some vias 130a-130n may be positioned adjacent the waveguide 122 to act as a portion of a wall of the waveguide 122. The portion may appear to the waveguide as a "fence".

A component 140 may implement the lid. The lid 140 generally has a thickness designed to minimize reflection of energy back into the cavity 121, without a risk of inducing oscillation. The lid generally includes the cavity 123 designed to reflect energy in the waveguide 122. In various embodiments, the lid 140 may be fabricated from an FR4 material.

A component 142 may implement a conductive layer. The conductive layer 142 may be disposed in the cavity 123 and forms a shorting plate (or backshort) for the waveguide 122. In some embodiments, a portion of the conductive layer 142 may be parallel to the probe 114 and spaced approximately one-quarter wavelength from the probe 114. The conductive layer 142 may connect physically with the conductive layer 104. The layer 142 is generally connected to the electrical ground. In some embodiments, the conductive layer 142 may be in electrical contact with the conductive layer 104. In other embodiments, the conductive layer 142 is isolated from the conductive layer 104, such as by an epoxy.

Figure 3:
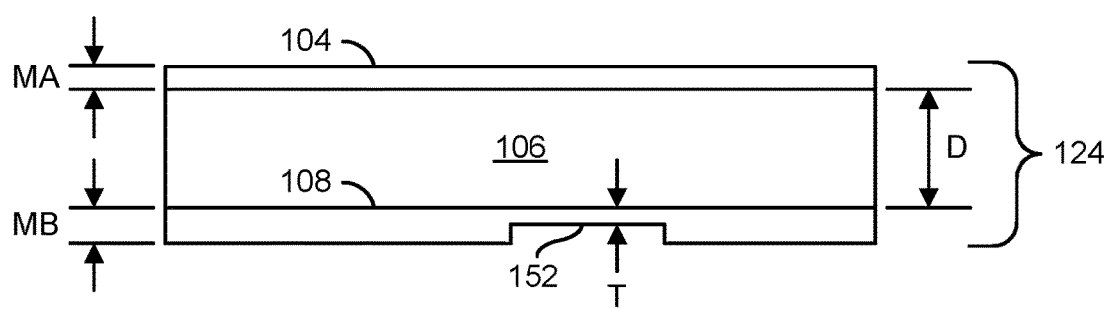
FIG. 3 is a diagram of a sample cross-sectional area of a laminate of a package in the apparatus.

Referring to FIG. 3, a diagram of a sample cross-sectional area of the laminate 124 of the package 100 is shown.

The laminate 124 generally comprises multiple, thin sheets of the layers 104-108. The laminate 124 generally allows the package 100 to be robust and inexpensive but with good electrical performance at the millimeter-wave frequencies.

The conductive layer 104 generally has a thickness (e.g., MA). The conductive layer 108 may have another thickness (e.g., MB). In various embodiments, the thickness MA and the thickness MB may be the same. For example, the thicknesses MA and MB may each be approximately 27 to 150 micrometers (um). In other embodiments, the thicknesses MA and MB may each be approximately 33 to 38 um (e.g., approximately 36 um±10%). In some embodiments, the thickness MA may be different than the thickness MB. For example, the thickness MB may be larger than the thickness MA. Other thicknesses MA and/or MB may be implemented to meet the design criteria of a particular application.

The dielectric layer 106 generally has a thickness (e.g., D). In various embodiments, the thickness D may be approximately 90 to 220 micrometers. Other thicknesses D may be implemented to meet the design criteria of a particular application. In particular, the thin dielectric layer 106 generally allows signal transmission in the waveguide 122 with low loss and without multi-moding.

Multiple channels 152 (a single channel is shown for simplicity) may be formed in a lower surface of the conductive layer 108 (e.g., a surface opposite the dielectric layer 106 and facing the substrate 92). The channels 152 may reduce a thickness of the conductive layer 108 from the thickness MB to a smaller thickness (e.g., T, where T<MB). In various embodiments, the thickness T may be approximately 10 to 140 micrometers. Other thicknesses T may be implemented to meet the design criteria of a particular application.

The thickness T of the conductive layer 108 in the channel area may be approximately half that of the normal thickness MB of the conductive layer 108. For example, where the thickness MB is 70 micrometers, the thickness T may be 35 micrometers. In another example, where the thickness MB is 150 micrometers, the thickness T may be 75 micrometers. The thickness T may be other percentages of the thickness MB to meet the design criteria of a particular application. In some embodiments, the channels 152 may be partially filled with a solder mask to stop hot solder from filling the channels 152.

A width of the channels 152 may be sized to allow hot gasses, created during a soldering phase to the substrate 92, to escape. In various embodiments, the channels 152 may have a small width. For example, the width of the channels 152 may range approximately 50 to 300 micrometers. Other widths of the channels 152 may be implemented to meet the design criteria of a particular application. The width of the channels 152 may also vary based on a distance from an edge of the laminate 124. For example, the channel widths may get larger as the channels 152 get closer to the outer edges of the laminate 124 to accommodate an accumulation of gases.

The waveguide 122 may convey radio-frequency signals to/from the probe 114. In various embodiments, the radio-frequency signals may reside in a range of millimeter-wave frequencies (e.g., above 30 gigahertz (GHz), including the waveguide E band and the waveguide W band, being 71 to 86 GHz and around 94 GHz respectively). In some embodiments, the radio-frequency signal may reside in a range of 30 GHz to 110 GHz. Other frequency bands and/or frequency ranges may be implemented to meet the design criteria of a particular application.

Figure 4:
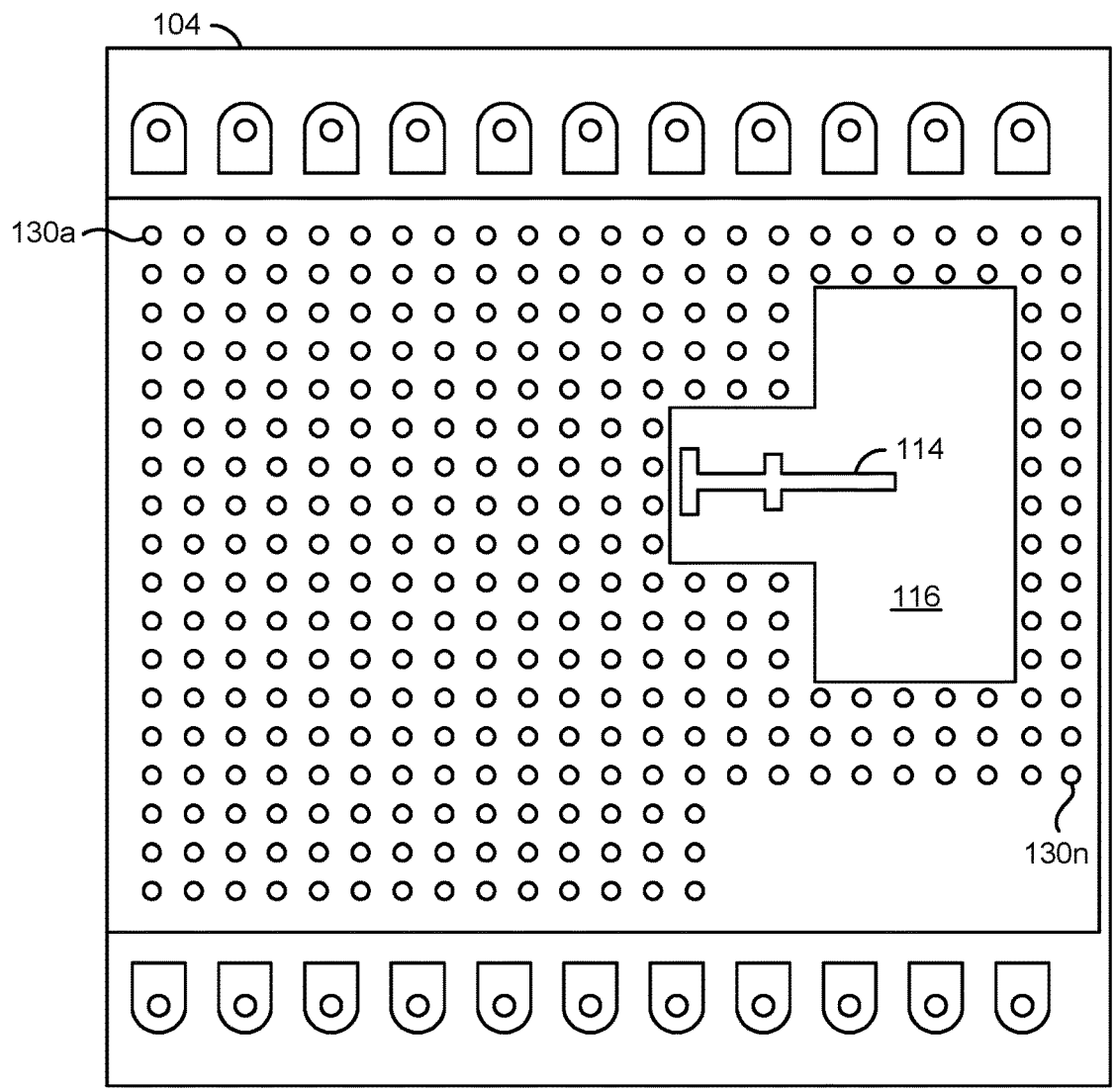
FIG. 4 is a layout diagram of an upper conductive layer.

Referring to FIG. 4, a layout diagram of an example implementation of the conductive layer 104 is shown. Positions of the vias 130a-130n are included in the diagram for clarity. The pattern of the conductive layer 104 generally includes a rectangle with pad areas on opposing sides. An area 116 may define a cross-sectional area of a waveguide where the conductive material has been fully removed. The area 116 is generally perpendicular to a direction of propagation in the waveguide 122.

Figure 5:
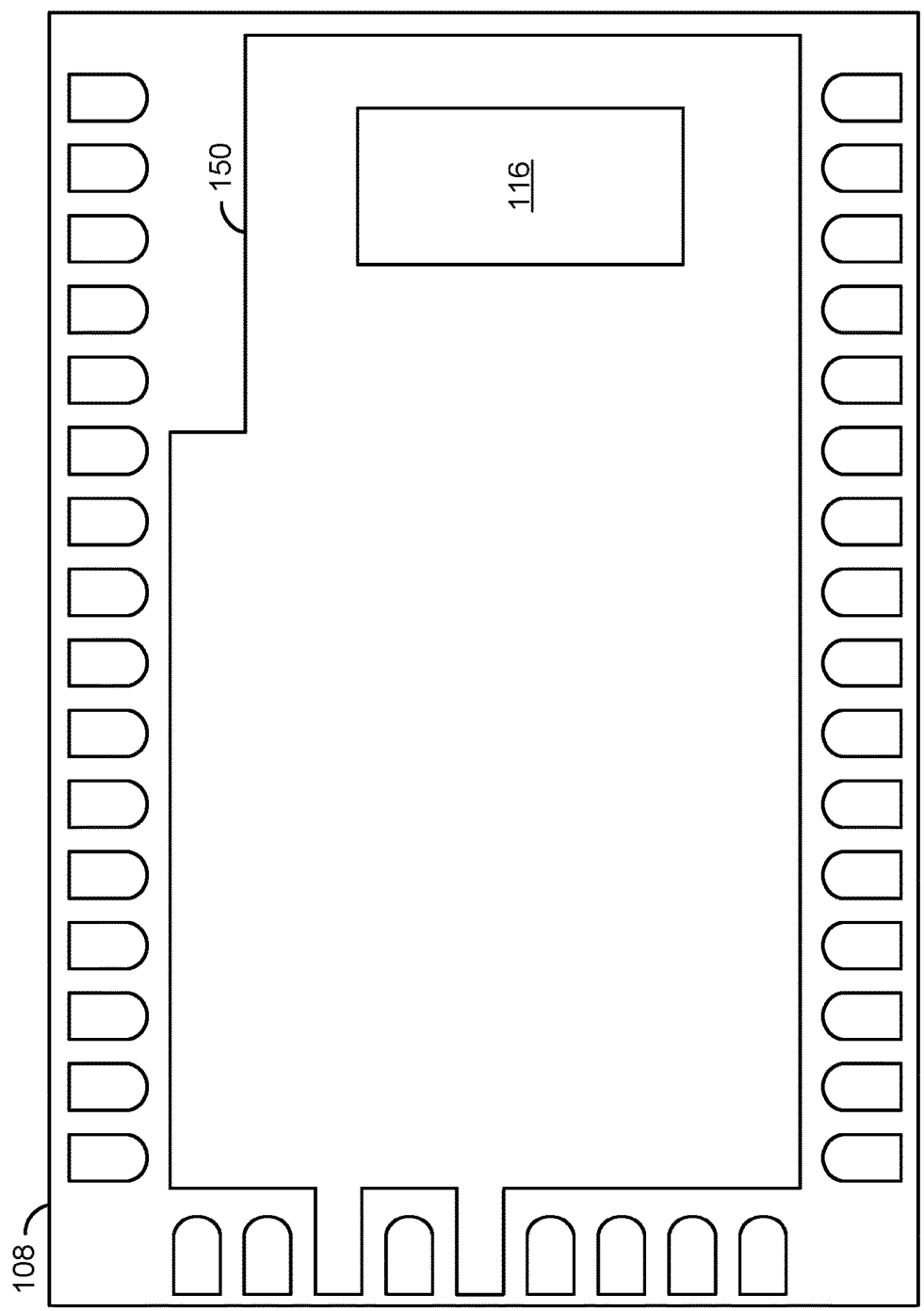
FIG. 5 is a layout diagram of a partial lower conductive layer.

Referring to FIG. 5, a layout diagram of a partial implementation of the conductive layer 108 is shown. The pattern of the conductive layer 108 generally includes a nearly rectangular area 150 with pad areas on three sides. The area 116 may define the cross-sectional area of a waveguide 122. As illustrated, the area 150 shows where metal is present before the channels 152 are formed.

Figure 6:
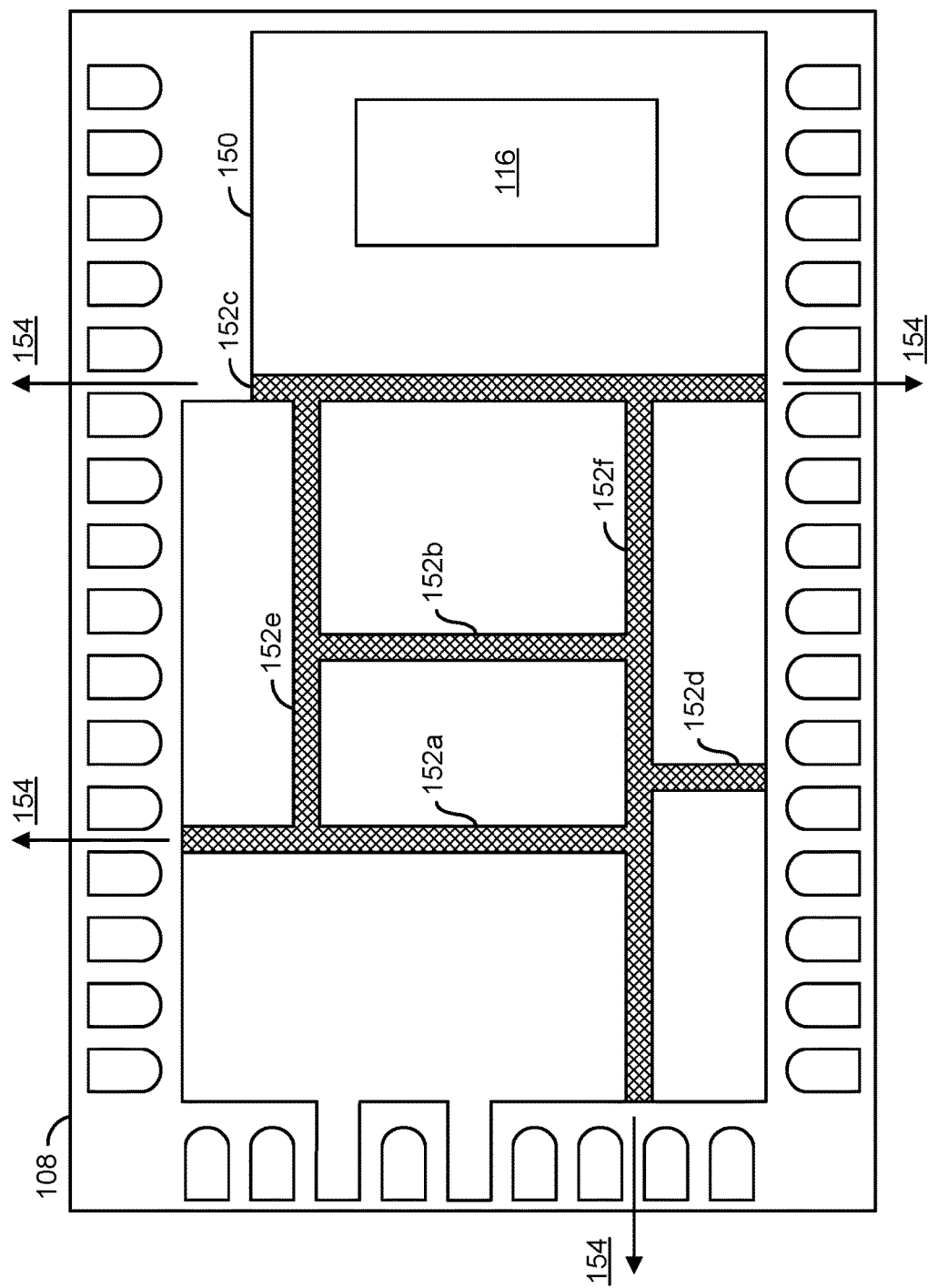
FIG. 6 is a layout diagram of the completed lower conductive layer.

Referring to FIG. 6, a layout diagram of an example implementation of the completed conductive layer 108 is shown. Multiple channels 152a-152f may be etched or cut into the conductive material in the area 150. In the example illustrated, each channel 152a-152f may be a straight channel of uniform width and uniform depth. Several channels may intersect to pass the gases 154 from a center of the area 150 to the outside edges of the conductive layer 108. In various embodiments, the channels 152a-152f may be backed-filled with a material to help stop hot solder from filling the channels 152a-152f during reflow. The backfill material may include, but is not limited to a solder mask or nickel oxide.

Figure 7:
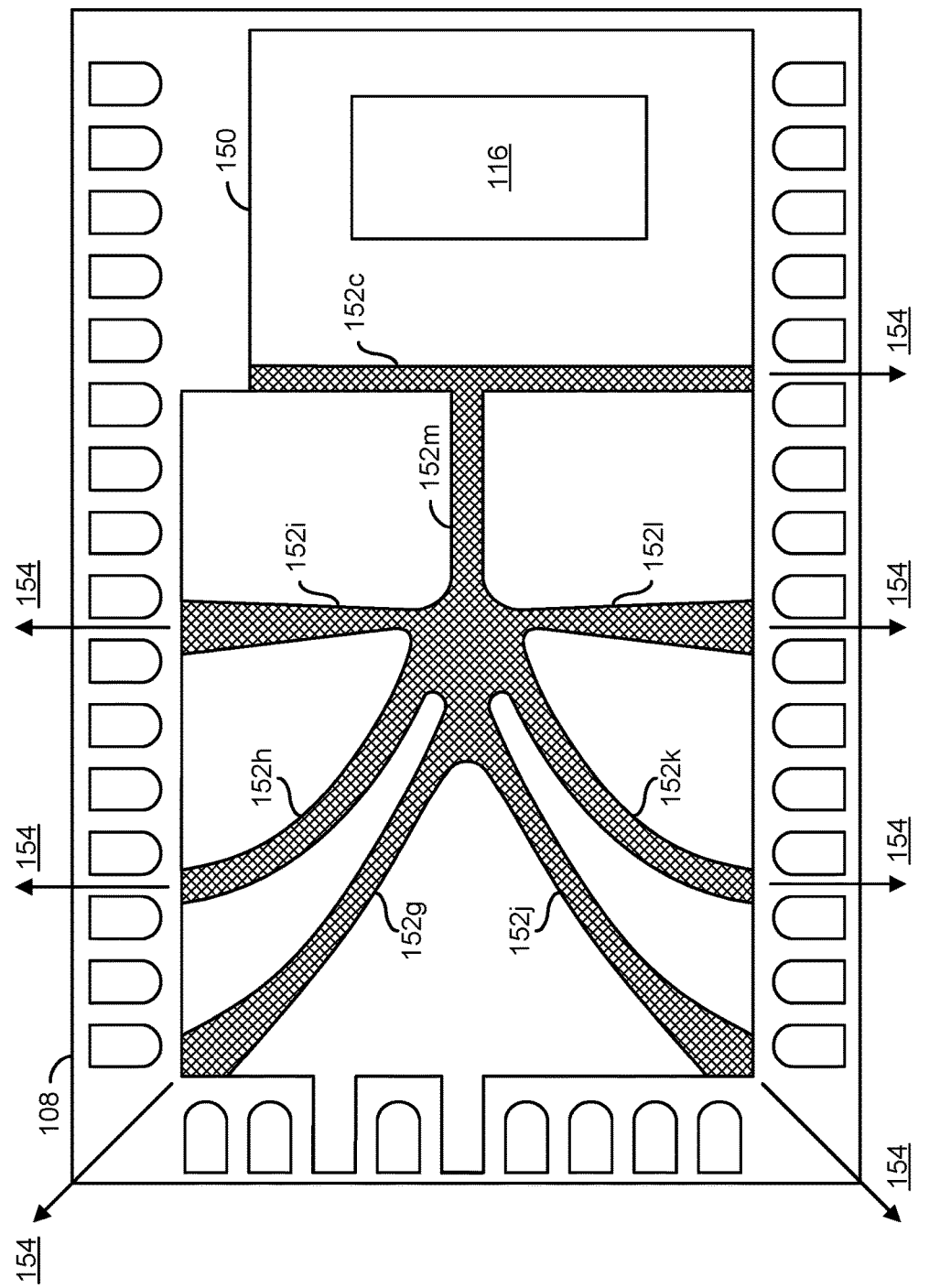
FIG. 7 is a layout diagram of another lower conductive layer.

Referring to FIG. 7, a layout diagram of another example implementation of the completed conductive layer 108 is shown. Multiple channels 152c and 152g-152m may be etched or cut into the conductive material in the area 150. In the example illustrated, some channel may be a straight (e.g., 152c and 152m) and/or curved (e.g., 152g, 152h, 152j and 152k). Some channels (e.g., 152g, 152i, 152j and 152l) may have a tapered (or variable) width and/or depth. Several channels may intersect to pass the gases 154 from a center of the area 150 to the outside edges of the conductive layer 108.

Figure 8:
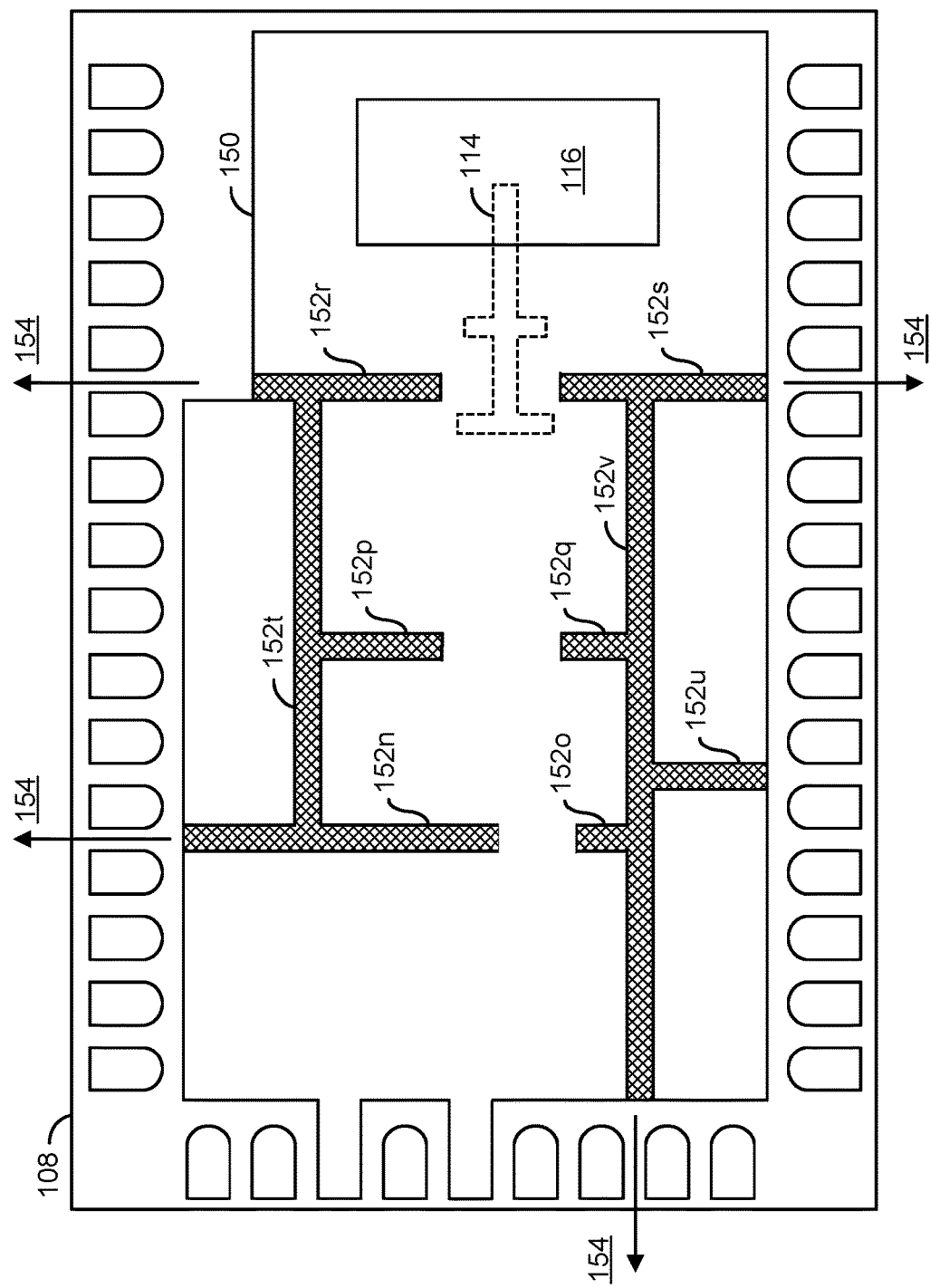
FIG. 8 is a layout diagram of yet another lower conductive layer.

Referring to FIG. 8, a layout diagram of yet another example implementation of the completed conductive layer 108 is shown. Multiple channels 152n-152v may be etched or cut into the conductive material in the area 150. In the example illustrated, the channels 152n-152v may not meet in a middle of the area 150 for better heat conduction. In various embodiments, the channels 152n-152v may be cut into the conductive layer 108 without cutting all the way through the conductive layer 108 (e.g., half etch), similar to the channels 152a-152m. By leaving the full thickness M of the conductive layer 108 between some of the channels (e.g., between 152n and 152o, between 152p and 152q, and between 152r and 152s), the full thickness conductive layer 108 may provide for better heat removal from the portion of the area 150 directly under the chip 102. The un-etched areas may also be located to provide the full thickness MB of the conductive layer 108 as a uniform ground plane under the probe 114. In other embodiments, some to all of the channels 152n-152v may be formed completely through (e.g., full etch) the conductive layer 108 to provide more space for the gasses to escape. In still other embodiments, some of the channels (e.g., 152v) may be partially etched under the chip 102 for good heat conduction, and fully etched away from the chip 102 (e.g., a tapered depth) for good gas extraction.

Figure 9:
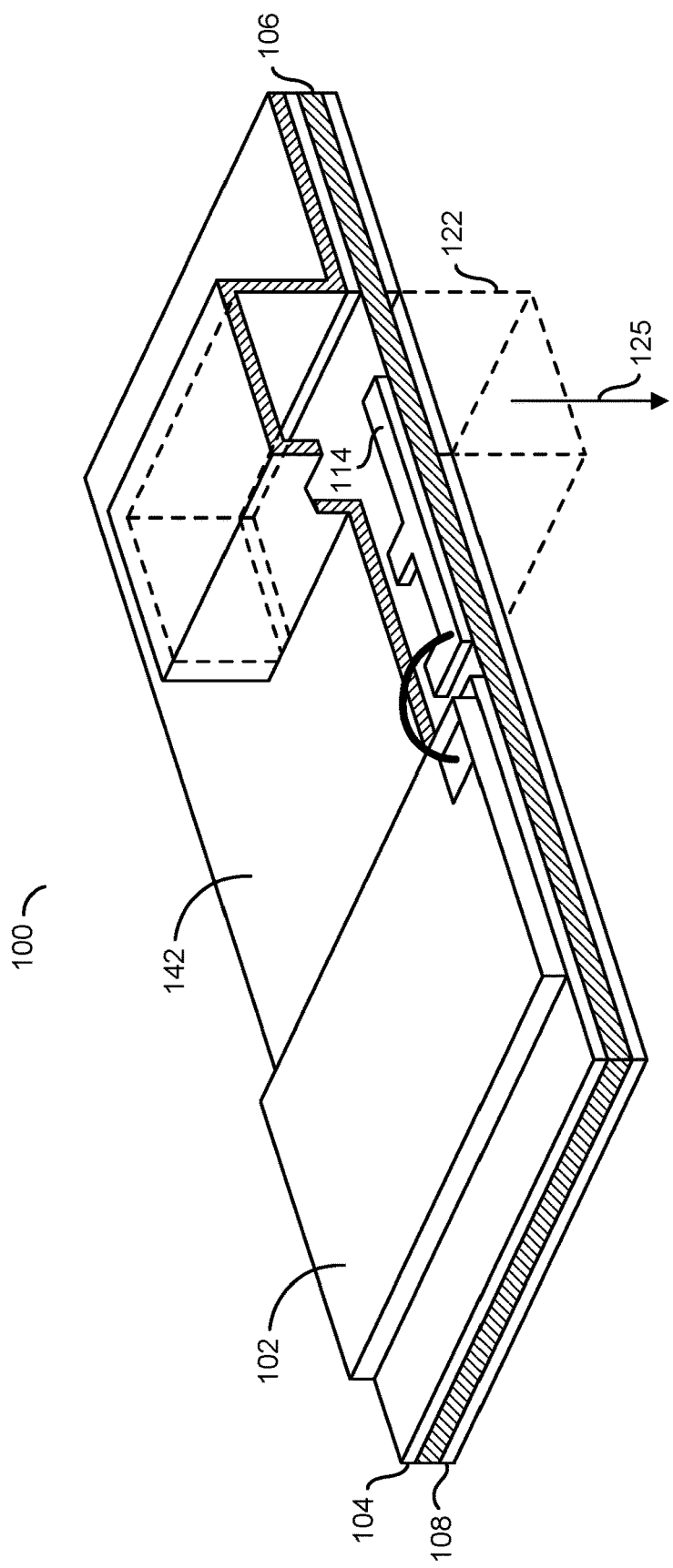
FIG. 9 is a diagram of a partial perspective view of the package.

Referring to FIG. 9, a diagram of a partial perspective view of the package 100 is shown. A direction 125 generally illustrates a direction of propagation of a radio-frequency signal away from the probe 114 within the waveguide 122. In various embodiments, the radio-frequency signal may propagate in the opposite direction of arrow 125, or in both directions.

Figure 10:
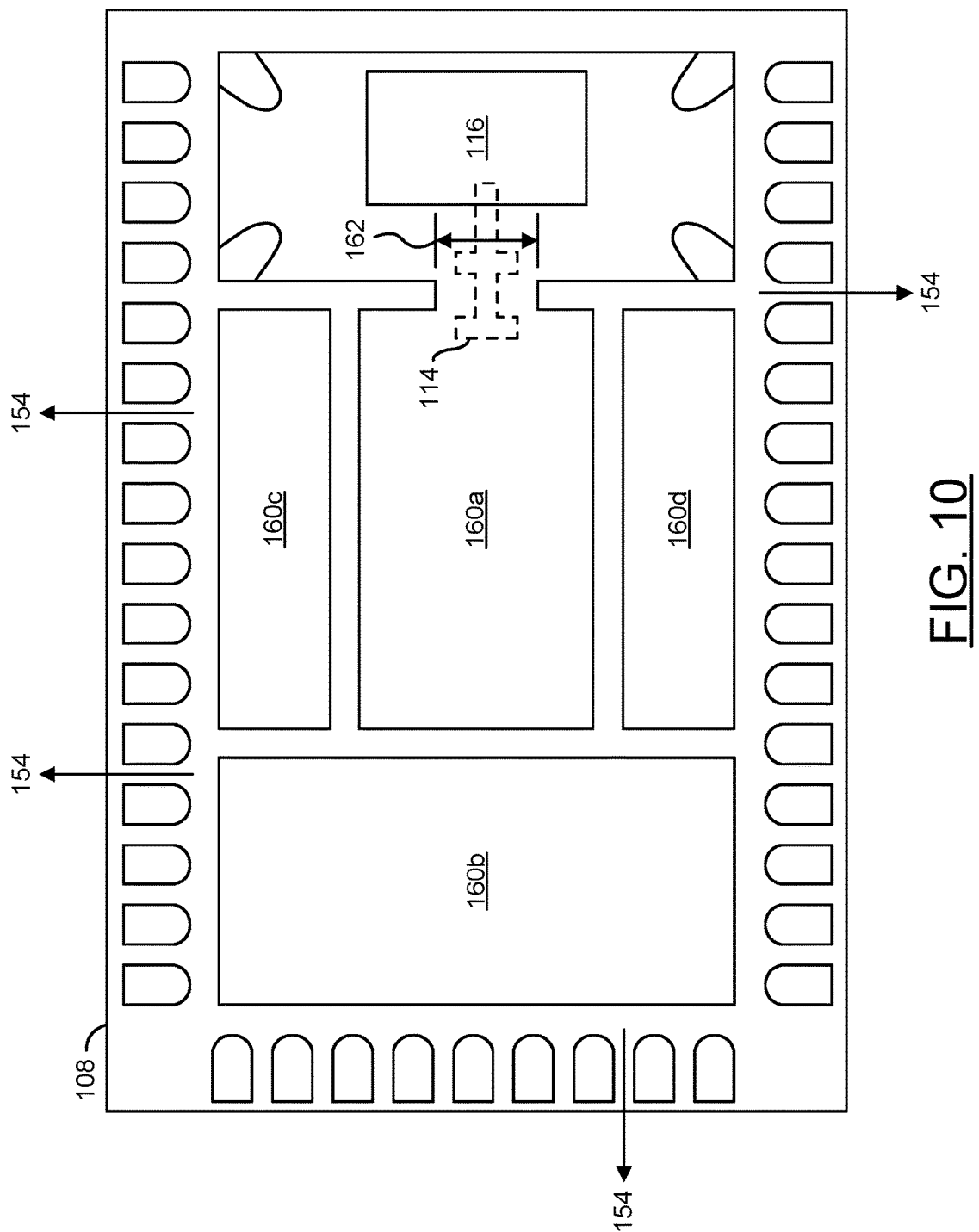
FIG. 10 is a layout diagram of a single lower conductive layer with islands.

Referring to FIG. 10, a layout diagram of an example implementation of a single conductive layer 108 is shown. The layout generally illustrates a configuration where the conductive layer 108 is the only conductive layer applied to the one side of the dielectric layer 106. Multiple regions (or islands) 160a-160d may be left behind in the conductive layer 108 after the channels are formed. A region (e.g., 160a) may extend from beneath the chip 102, under the probe 114 and around the area 116 of the waveguide. Channels (or gaps) between the regions 160a-160d may allow the gases 154 to escape during the soldering phase of fabrication. A "waist" area may be included proximate the probe 114. The waist area may have a width 162 (e.g., 1 millimeter) sufficiently wide so that the conductive material 108 is always directly beneath the probe 114 to form a solid radio-frequency ground plane. Other regions 160c-160d may be included in the layout where grounding matters, such as below the wire bonds 120 to the chip 102 and other transitions.

Figure 11:
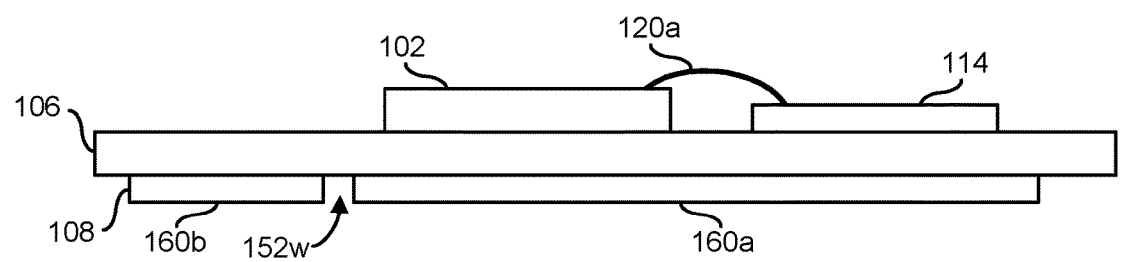
FIG. 11 is a diagram of a cross-sectional view of the package of FIG. 10.

Referring to FIG. 11, a diagram of a cross-sectional view of the package 100 of FIG. 10 is shown. The island 160a formed in the conductive layer 108 may extend totally under the chip 102, under the probe 114 and around the area 116. A channel 152w is illustrated in the gap between the region 160a and the region 160b. The channel 152w is also illustrated extended through the entire thickness of the conductive layer 108. In other embodiments, the channel 152w may extend partially through the thickness of the conductive layer 108, as shown in FIG. 3.

Figure 12:
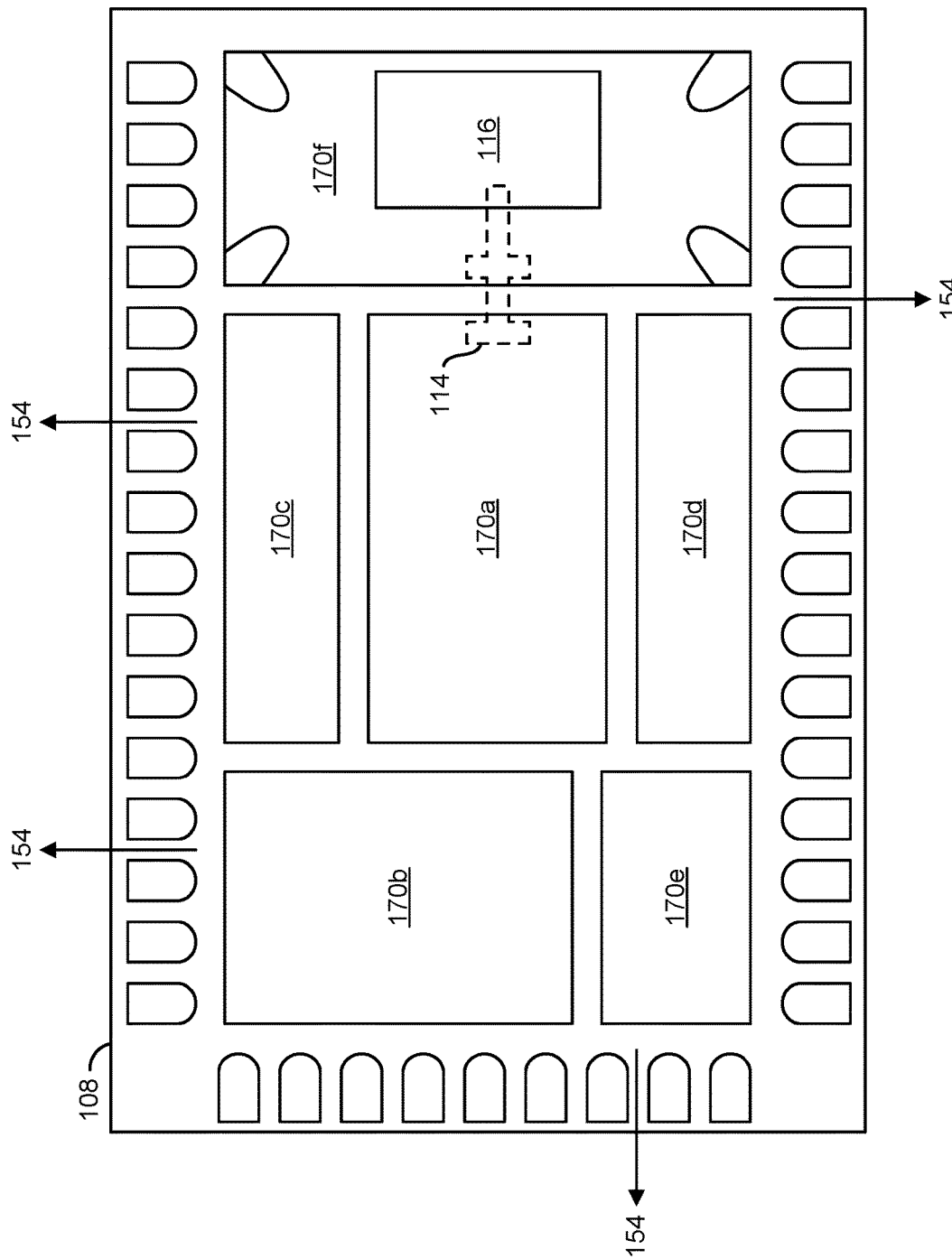
FIG. 12 is a layout diagram of a double lower conductive layer.

Referring to FIG. 12, a layout diagram of an example implementation of a double conductive layer is shown. The layout generally illustrates a configuration where both the conductive layer 108 and an additional conductive layer 110 (see FIG. 13) are applied to the one side of the dielectric layer 106. Multiple regions (or islands) 170a-170f may be formed in the additional conductive layer 110 above the regions 160a-160d. Channels (or gaps) between the regions 170a-170f may allow the gases 154 to escape during the soldering phase of fabrication.

Figure 13:
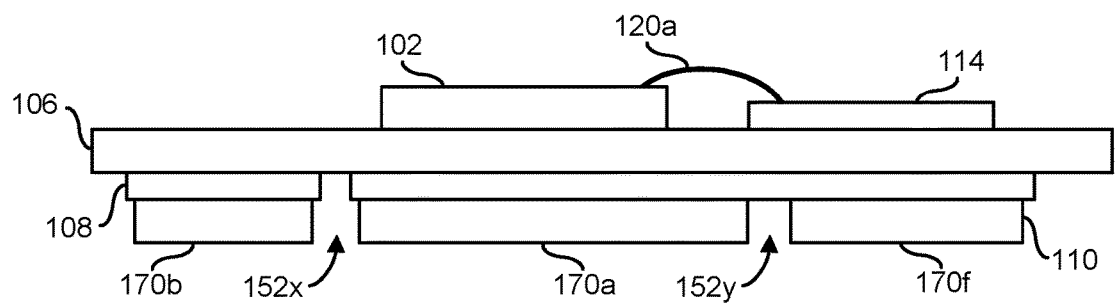
FIG. 13 is a diagram of a cross-sectional view of the package of FIG. 12.

Referring to FIG. 13, a diagram of a cross-sectional view of the package 100 of FIG. 12 is shown. As illustrated, one or more of the channels (e.g., 152x) may be cut in both the conductive layer 108 and the conductive layer 110. In some embodiments, one or more of the channels (e.g., 152y) may be cut only into the conductive layer 110. In other embodiments, the channel 152x may be cut only partially into the conductive layer 108. Likewise, the channel 152y may be cut only partially into the conductive layer 110.

The conductive layer 110 may be formed adjoining the conductive layer 108. In some fabrication processes, the conductive layer 110 may be plated onto the conductive layer 108 and subsequently etched to form the channels. In other fabrication processes, the channels may be defined in a photo-resist layer and the conductive layer 110 is deposited into the regions 170a-170f.

Figure 14:
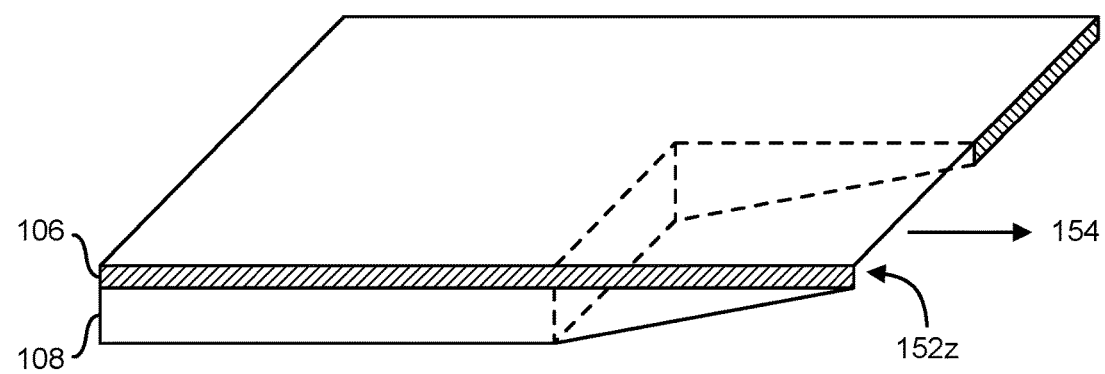
FIG. 14 is a diagram of another partial perspective view of the package with a tapered-depth channel.

Referring to FIG. 14, a diagram of another partial perspective view of the package 100 is shown with a tapered-depth channel. In various embodiments, a thickness of the conductive layer 108 (shown) and/or the conductive layer 110 (not shown) may be varied (or tapered) to form one or more of the channels 152. As illustrated, a depth of a channel 152z may be tapered (or sloped) with a taller end of the channel 152z facing an outside edge of the package 100. In various embodiments, the slope may be achieved by a sequence of steps etched into the conductive layers 108 and/or 110. The sloping of the depth of the channel 152z generally aids in moving the gasses 154 away from the center of the package 100 toward the outside edges during the soldering phase.

The functions and structures illustrated in the diagrams of FIGS. 1 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a laminate comprising a dielectric layer between a first conductive layer and a second conductive layer, wherein (i) said first conductive layer comprises a probe configured to transfer a radio-frequency signal in a millimeter-wave band, (ii) said second conductive layer is configured to provide a continuous ground plane parallel to said probe and separated from said probe by said dielectric layer, and (iii) a plurality of channels are (a) formed into a side of said second conductive layer opposite said dielectric layer, (b) formed to a depth less than a thickness of said second conductive layer, and (c) sized to permit gasses formed while securing said laminate to a substrate to escape from between said laminate and said substrate; and
   a lid in contact with said first conductive layer.

2. The apparatus according to claim 1, wherein said channels comprise one or more parallel channels.

3. The apparatus according to claim 1, wherein said channels comprise one or more perpendicular channels.

4. The apparatus according to claim 1, wherein said channels comprise one or more crossing channels.

5. The apparatus according to claim 1, wherein said channels comprise one or more curved channels.

6. The apparatus according to claim 1, wherein said channels comprise one or more tapered-width channels.

7. The apparatus according to claim 1, wherein said depth of said channels is approximately half of said thickness of said second conductive layer.

8. The apparatus according to claim 1, wherein said millimeter-wave band of said radio-frequency signal is approximately 30 gigahertz to approximately 110 gigahertz.

9. The apparatus according to claim 1, further comprising an integrated circuit (i) mounted on said first conductive layer, (ii) electrically connected to said probe and (iii) covered by said lid.

10. The apparatus according to claim 1, wherein (i) said channels divide said second conductive layer into a plurality of regions and (ii) one of said regions extends from a chip to an edge of a waveguide with a width sufficient to provide said continuous ground plane for said probe.

11. The apparatus according to claim 10, wherein an additional one or more of said channels extends completely through said thickness of said second conductive layer.

12. The apparatus according to claim 10, further comprising a third conductive layer formed adjoining said second conductive layer.

13. The apparatus according to claim 12, wherein one or more additional channels are formed in said third conductive layer.

14. The apparatus according to claim 1, wherein a depth of one or more of said channels is variable.

15. The apparatus according to claim 1, wherein said dielectric layer is configured to pass through a cross-sectional area of a waveguide perpendicular to a direction of propagation in said waveguide.

16. The apparatus according to claim 15, wherein said second conductive layer has a cutout in said cross-sectional area of said waveguide.

17. The apparatus according to claim 15, wherein said probe extends (i) into said cross-sectional area and (ii) is radio-frequency coupled to said waveguide.

18. The apparatus according to claim 15, further comprising a plurality of vias (i) in said dielectric layer, (ii) filled with a conductive material and (iii) positioned to form part of a wall of said waveguide.

19. The apparatus according to claim 15, wherein said lid comprises a shorting plate perpendicular to said direction of propagation in said waveguide and offset from said probe.

20. An apparatus comprising:
a laminate comprising a dielectric layer and a plurality of conductive layers, wherein (i) said dielectric layer is configured to pass through a cross-sectional area of a waveguide perpendicular to a direction of propagation in said waveguide, (ii) a first conductive layer of said laminate adjoins said dielectric layer and comprises a probe coupled to said waveguide to transfer a radio-frequency signal, and (iii) a second conductive layer of said laminate resides on an opposite side of said dielectric layer as said first conductive layer and has a cutout in said cross-sectional area of said waveguide; and
a lid (i) in contact with said first conductive layer and (ii) comprising a shorting plate perpendicular to said direction of propagation in said waveguide and offset from said probe.

* * * * *